(12) United States Patent
Hemink et al.

(10) Patent No.: US 8,218,367 B2
(45) Date of Patent: *Jul. 10, 2012

(54) VERIFICATION PROCESS FOR NON-VOLATILE STORAGE

(75) Inventors: Gerrit Jan Hemink, Yokohama (JP); Shih-Chung Lee, Yokohama (JP); Toru Miwa, Yokohama (JP); Yupin Fong, Fremont, CA (US); Jun Wan, San Jose, CA (US); Ken Oowada, Kanagawa (JP)

(73) Assignee: SanDisk Technologies Inc., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/154,810

(22) Filed: Jun. 7, 2011

(65) Prior Publication Data

US 2011/0235423 A1 Sep. 29, 2011

Related U.S. Application Data

(63) Continuation of application No. 12/132,452, filed on Jun. 3, 2008, now Pat. No. 7,978,527.

(51) Int. Cl.
*G11C 16/06* (2006.01)
(52) U.S. Cl. .......... 365/185.22; 365/185.29; 365/185.17
(58) Field of Classification Search ............. 365/185.22, 365/185.29, 185.17, 185.18
See application file for complete search history.

(56) References Cited

U.S. PATENT DOCUMENTS

| | | | |
|---|---|---|---|
| 5,270,979 A | 12/1993 | Harari | |
| 5,963,477 A | 10/1999 | Hung | |
| 5,995,417 A | 11/1999 | Chen | |
| 6,620,682 B1 | 9/2003 | Lee | |
| 7,009,889 B2 | 3/2006 | Tran | |
| 7,978,527 B2 * | 7/2011 | Hemink et al. | 365/185.22 |
| 2002/0126539 A1 | 9/2002 | Roohparvar | |
| 2004/0105310 A1 | 6/2004 | Arai | |
| 2005/0041515 A1 | 2/2005 | Futatsuyama | |
| 2006/0140012 A1 | 6/2006 | Wan | |
| 2006/0221660 A1 | 10/2006 | Hemink | |
| 2007/0183220 A1 | 8/2007 | Aritome | |
| 2007/0230249 A1 | 10/2007 | Miyaki | |
| 2008/0089134 A1 | 4/2008 | Ito | |

FOREIGN PATENT DOCUMENTS

WO WO2007/143399 12/2007

OTHER PUBLICATIONS

European Response to Office Action dated Sep. 6, 2011, European Patent Appl. 09759067.3.
European Office Action dated Apr. 20, 2011, European Patent Appl. 09759067.3.
PCT International Search Report dated Jul. 9, 2009, PCT Patent Appl. No. PCT/US2009/045358.
PCT Written Opinion of the International Searching Authority dated Jul. 9, 2009, PCT Patent Appl. No. PCT/US2009/045358.

(Continued)

*Primary Examiner* — Huan Hoang
(74) *Attorney, Agent, or Firm* — Vierra Magen Marcus & DeNiro LLP

(57) ABSTRACT

When erasing non-volatile storage, a verification process is used between erase operations to determine whether the non-volatile storage has been successfully erased. The verification process includes separately performing verification for different subsets of the non-volatile storage elements.

26 Claims, 15 Drawing Sheets

| Word Line | Verify 1st group | Verify 2nd group | Verify 3rd group | Verify 4th group |
|---|---|---|---|---|
| WL0 | Vcgev | Vread | Vread | Vread |
| WL1 | Vcgev | Vread | Vread | Vread |
| WL2 | Vcgev | Vread | Vread | Vread |
| WL3 | Vcgev | Vcgev | Vread | Vread |
| WL4 | Vcgev | Vcgev | Vread | Vread |
| WL5 | Vread | Vcgev | Vread | Vread |
| WL6 | Vread | Vcgev | Vread | Vread |
| WL7 | Vread | Vcgev | Vcgev | Vread |
| WL8 | Vread | Vcgev | Vcgev | Vread |
| WL9 | Vread | Vread | Vcgev | Vread |
| WL10 | Vread | Vread | Vcgev | Vread |
| WL11 | Vread | Vread | Vcgev | Vcgev |
| WL12 | Vread | Vread | Vcgev | Vcgev |
| WL13 | Vread | Vread | Vread | Vcgev |
| WL14 | Vread | Vread | Vread | Vcgev |
| WL15 | Vread | Vread | Vread | Vcgev |
| WL16 | Vread | Vread | Vread | Vcgev |
| WL17 | Vread | Vread | Vread | Vread |

OTHER PUBLICATIONS

European Response to Office Action, European Patent Appl. 09759067.3.
Office Action dated Mar. 19, 2010, U.S. Appl. No. 12/132,452.
Response to Office Action dated Jul. 15, 2010, U.S. Appl. No. 12/132,452.
Office Action dated Sep. 29, 2010, U.S. Appl. No. 12/132,452.
Response to Office Action dated Dec. 17, 2010, U.S. Appl. No. 12/132,452.
Notice of Allowance dated Mar. 17, 2011, U.S. Appl. No. 12/132,452.

* cited by examiner

Fig. 7B

| Signal | Read | Erase | Traditional Erase-Verify | Soft Programming |
|---|---|---|---|---|
| Bit Line | .7v | floating | Vbl | 0v |
| SGD | Vsg | floating | Vsg | Vsgd |
| WL7 | Vread | 0v | 0v | Vspgm |
| WL6 | Vread | 0v | 0v | Vspgm |
| WL5 | Vread | 0v | 0v | Vspgm |
| WL4 | Vcgrv = 0v | 0v | 0v | Vspgm |
| WL3 | Vread | 0v | 0v | Vspgm |
| WL2 | Vread | 0v | 0v | Vspgm |
| WL1 | Vread | 0v | 0v | Vspgm |
| WL0 | Vread | 0v | 0v | Vspgm |
| SGS | Vsg | floating | Vsg | 0v |
| Source | 0v | floating | Vdd | 1-1.5v |
| P-well | 0v | Verase | 0v | 0v |

Fig. 11

| Word Line | Verify 1st group | Verify 2nd group | Verify 3rd group | Verify 4th group |
|---|---|---|---|---|
| WL0 | Vcgev | Vread | Vread | Vread |
| WL1 | Vcgev | Vread | Vread | Vread |
| WL2 | Vcgev | Vread | Vread | Vread |
| WL3 | Vcgev | Vcgev | Vread | Vread |
| WL4 | Vcgev | Vcgev | Vread | Vread |
| WL5 | Vread | Vcgev | Vread | Vread |
| WL6 | Vread | Vcgev | Vread | Vread |
| WL7 | Vread | Vcgev | Vcgev | Vread |
| WL8 | Vread | Vcgev | Vcgev | Vread |
| WL9 | Vread | Vread | Vcgev | Vread |
| WL10 | Vread | Vread | Vcgev | Vread |
| WL11 | Vread | Vread | Vcgev | Vcgev |
| WL12 | Vread | Vread | Vcgev | Vcgev |
| WL13 | Vread | Vread | Vread | Vcgev |
| WL14 | Vread | Vread | Vread | Vcgev |
| WL15 | Vread | Vread | Vread | Vcgev |
| WL16 | Vread | Vread | Vread | Vcgev |
| WL17 | Vread | Vread | Vread | Vread |

...

⋮

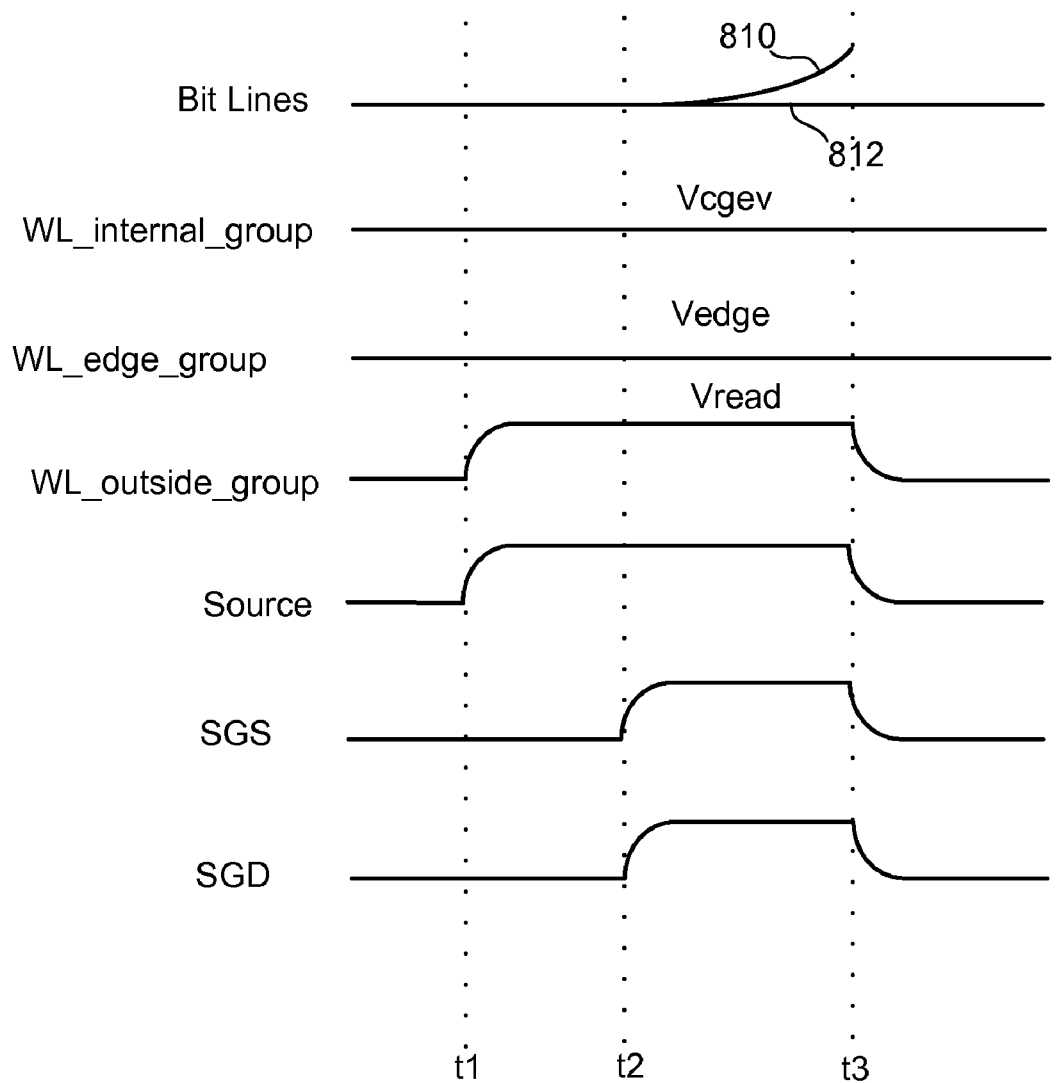

Fig. 15

| Word Line | Verify 1st group | Verify 2nd group | Verify 3rd group | Verify 4th group |
|---|---|---|---|---|
| WL0 | Vcgev | Vread | Vread | Vread |
| WL1 | Vcgev | Vread | Vread | Vread |
| WL2 | Vcgev | Vread | Vread | Vread |
| WL3 | Vcgev | Vread | Vread | Vread |
| WL4 | Vedge | Vread | Vread | Vread |
| WL5 | Vread | Vedge | Vread | Vread |
| WL6 | Vread | Vcgev | Vread | Vread |
| WL7 | Vread | Vcgev | Vread | Vread |
| WL8 | Vread | Vcgev | Vread | Vread |
| WL9 | Vread | Vedge | Vread | Vread |
| WL10 | Vread | Vread | Vedge | Vread |
| WL11 | Vread | Vread | Vcgev | Vread |
| WL12 | Vread | Vread | Vcgev | Vread |
| WL13 | Vread | Vread | Vcgev | Vread |
| WL14 | Vread | Vread | Vedge | Vread |
| WL15 | Vread | Vread | Vread | Vedge |
| WL16 | Vread | Vread | Vread | Vcgev |
| WL17 | Vread | Vread | Vread | Vcgev |
| WL18 | Vread | Vread | Vread | Vcgev |
| WL19 | Vread | Vread | Vread | Vedge |

VERIFICATION PROCESS FOR NON-VOLATILE STORAGE

CLAIM OF PRIORITY

This application is a continuation application of U.S. patent application Ser. No. 12/132,452, "VERIFICATION PROCESS FOR NON-VOLATILE STORAGE," filed on Jun. 3, 2008, which is incorporated herein by reference in its entirety.

BACKGROUND

1. Field

The present invention relates to technology for non-volatile storage.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate. Thus, a memory cell (which can include one or more transistors) can be programmed and/or erased by changing the level of charge on a floating gate in order to change the threshold voltage.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique For Non-Volatile Memory," and in U.S. Patent Application Publication 2005/0024939, titled "Detecting Over Programmed Memory," both of which are incorporated herein by reference in their entirety. In many devices, the program voltage applied to the control gate during a program operation is applied as a series of pulses in which the magnitude of the pulses is increased by a predetermined step size for each successive pulse. Between programming pulses are one or more verify operations to determined whether the memory cell has been properly programmed.

Each memory cell can store data (analog or digital). When storing one bit of digital data (referred to as a binary memory cell), possible threshold voltages of the memory cell are divided into two ranges which are assigned logical data "1" and "0." In one example, the threshold voltage is negative after the memory cell is erased, and defined as logic "1." After programming, the threshold voltage is positive and defined as logic "0." When the threshold voltage is negative and a read operation is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple levels of information (referred to as a multi-state memory cell). In the case of storing multiple levels of data, the range of possible threshold voltages is divided into the number of levels of data. For example, if four levels of information is stored, there will be four threshold voltage ranges assigned to the data values "11", "10", "01", and "00." In one example, the threshold voltage after an erase operation is negative and defined as "11." Positive threshold voltages are used for the states of "10", "01" and "00." If eight levels of information (or states) are stored in each memory cell (e.g. for three bits of data), there will be eight threshold voltage ranges assigned to the data values "000", "001", "010", "011" "100", "101", "110" and "111." The specific relationship between the data programmed into the memory cell and the threshold voltage levels of the memory cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray Code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted to reduce data pattern sensitivity and even wear on the memory cells. Different encoding schemes can be used.

Memory cells can be erased by raising the substrate to an erase voltage (e.g., 20 volts) for a sufficient period of time and grounding the word lines of a selected block while the source and bit lines are floating. Due to capacitive coupling, the unselected word lines, bit lines, select lines, and the common source line are also raised to a significant fraction of the erase voltage. A strong electric field is thus applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the substrate, the threshold voltage of a selected cell is lowered. Erasing can be performed on the entire memory array, on individual blocks, or another unit of cells.

When memory cells are erased, it is important that they are not over-erased. That is, it is desired that the threshold voltage of an erased memory cell not be below a target range. Over-erasing could reduce performance of subsequent programming and may have a negative influence on the endurance of memory cells.

SUMMARY

To accurately erase memory cells without over-erasing, a verification process is used between erase operations to determine whether the non-volatile storage has been successfully erased. The verification process includes separately performing verification for different subsets of the non-volatile storage elements.

One embodiment includes performing an erase function on a set of non-volatile storage elements and separately performing verification for different overlapping and contiguous subsets of the non-volatile storage elements in response to the erase function. In one example implementation, the separately performing verification for different overlapping contiguous subsets of non-volatile storage elements in response to the particular erase function comprises applying multiple sets of testing signals, at different times to the overlapping and contiguous subsets of non-volatile storage devices and, at the different times and in response to the testing signals, sensing condition information of non-volatile storage elements receiving the testing signals.

One embodiment includes applying one or more testing signals to a first contiguous and connected group of non-volatile storage elements, sensing condition information for the first contiguous and connected group of non-volatile storage elements in response to the one or more testing signals applied to the first contiguous and connected group of non-volatile storage elements, applying one or more testing signals to a second contiguous and connected group of non-volatile storage elements that overlaps with the first contiguous and connected group of non-volatile storage elements, and sensing condition information for the second contiguous and connected group of connected non-volatile storage elements in response to the one or more testing signals applied to the second contiguous and connected group of non-volatile storage elements.

One embodiment includes a plurality of non-volatile storage elements and one or more managing circuits in communication with the plurality of non-volatile storage elements. The one or more managing circuits apply multiple sets of testing signals at different times to overlapping and contiguous subsets of non-volatile storage devices. The one or more managing circuits sense condition information of non-volatile storage elements receiving the testing signals. The one or more managing circuits perform the sensing at the different times and in response to the testing signals.

One embodiment includes a plurality of non-volatile storage elements, means for sequentially applying different testing situations to the plurality of non-volatile storage elements, and means for sensing a conditions of the subsets of the non-volatile storage in response to the testing conditions. Each of the testing situations includes application of testing signals to a different subset of a plurality of overlapping and contiguous subsets of the non-volatile storage elements.

One embodiment includes performing an erase function on a set of non-volatile storage elements and separately verifying (for the erase function) different subsets of the non-volatile storage elements including applying different testing signals to non-volatile storage elements at edges of subsets being verified than to non-volatile storage elements in subsets being verified but not at edges.

One embodiment includes applying testing signals to a first group of non-volatile storage elements including applying a different testing signal to a non-volatile storage element at an edge of the first group as compared to non-volatile storage elements not at edges of the first group and applying overdrive signals to non-volatile storage elements not in the first group, sensing condition information for the first group of non-volatile storage elements, applying testing signals to a second group of non-volatile storage elements including applying a different testing signal to a non-volatile storage element at an edge of the second group as compared to non-volatile storage elements not at edges of the second group and applying overdrive signals to non-volatile storage elements not in the second group, and sensing condition information for the second group of connected non-volatile storage elements. The first group is different then the second group.

One embodiment includes a plurality of non-volatile storage elements and one or more managing circuits in communication with the plurality of non-volatile storage elements. The one or more managing circuits separately apply testing signals to different subsets of non-volatile storage devices including applying a different testing signal to a non-volatile storage element at an edge of a particular subset as compared to non-volatile storage elements not at edges of the particular subset. The one or more managing circuits sense condition information for the different subsets in response to the testing signals.

One embodiment includes a plurality of non-volatile storage elements, means for performing an erase function on the non-volatile storage elements, and means for separately verifying (for the erase function) different subsets of the non-volatile storage elements including applying a different testing voltage to a non-volatile storage element at an edge of a subset being verified than non-volatile storage elements not at edges of the subset being verified.

BRIEF DESCRIPTION OF THE DRAWINGS

FIG. 7B describes bias conditions for a NAND string during read, erase, erase-verify and soft programming operations.
FIG. 11 is a table that depicts how different subsets of memory cells are verified.
FIG. 14 is a signal diagram that describes a verify operation for non-volatile storage.
FIG. 15 is a table that depicts how different subsets of memory cells are verified.

DETAILED DESCRIPTION

Figure 1:
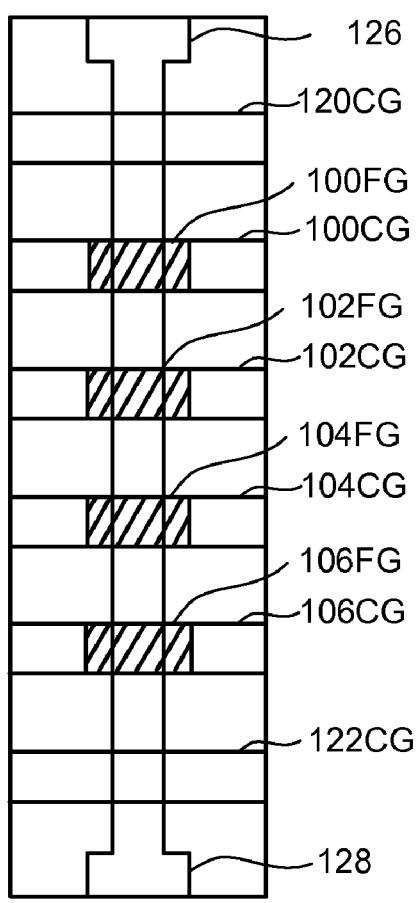
FIG. 1 is a top view of a NAND string.
Figure 2:
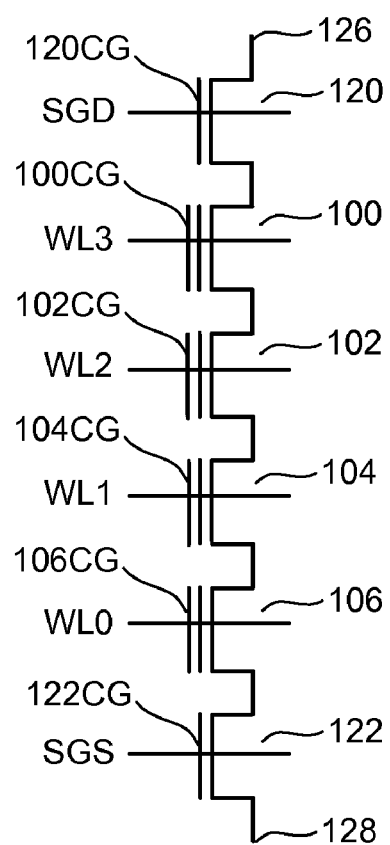
FIG. 2 is an equivalent circuit diagram of the NAND string.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (drain side) select gate 120 and a second (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

Relevant examples of NAND type flash memories and their operation are provided in the following U.S. Patents/Patent Applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348.

Other types of non-volatile storage devices, in addition to NAND flash memory, can also be used. For example, non-volatile memory devices are also manufactured from memory cells that use a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric. Non-volatile storage based on MONOS or TANOS types of structures or nanocrystals can also be used. Other types of non-volatile storage can also be used.

Figure 3:
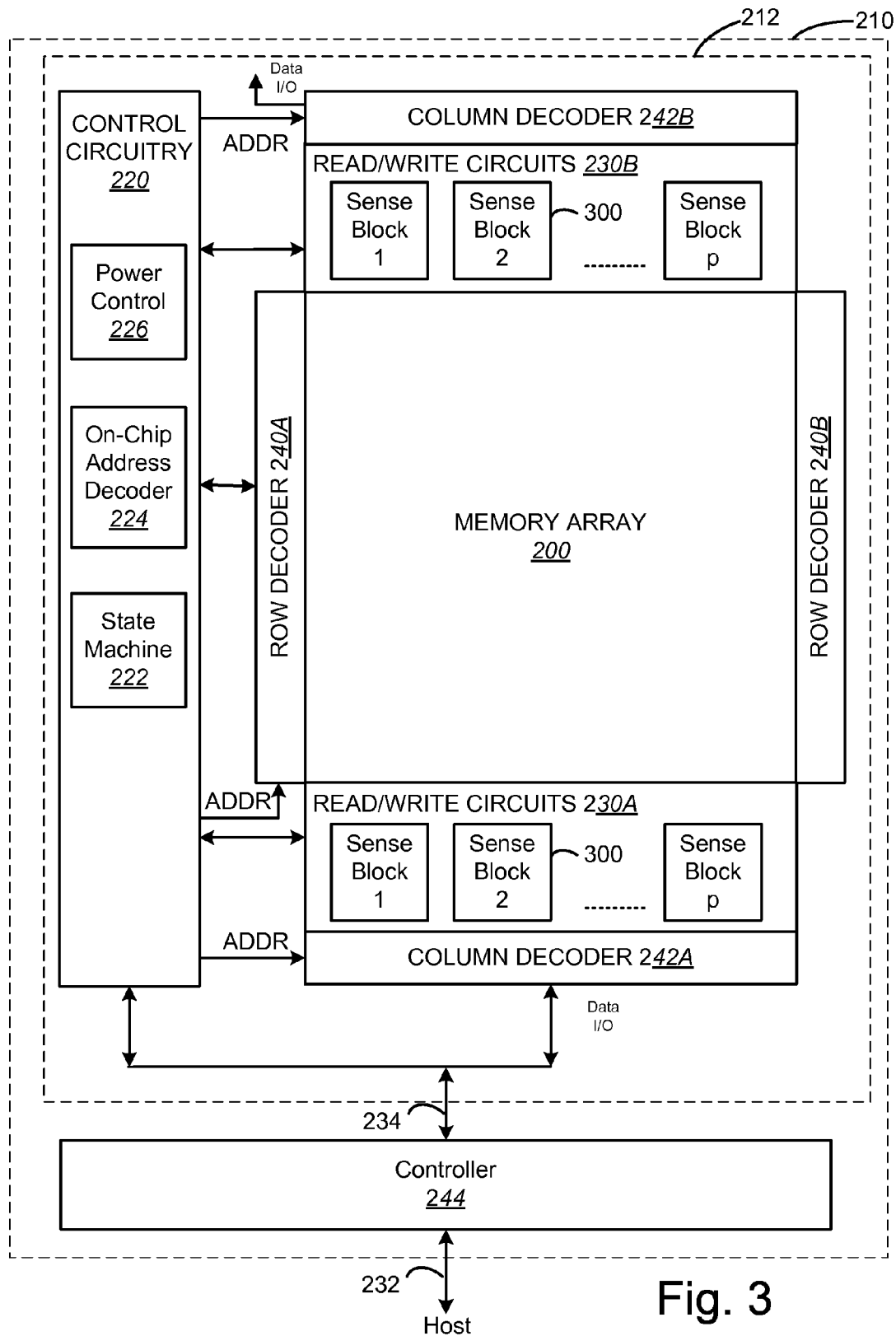
FIG. 3 is a block diagram of a non-volatile memory system.

FIG. 3 illustrates a memory device 210 having read/write circuits for reading and programming a page (or other unit) of memory cells (e.g., NAND multi-state flash memory) in parallel. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. Word lines and bit lines are examples of control lines. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234.

Control circuitry 220 cooperates with the read/write circuits 230A and 230B to perform memory operations on the memory array 200. The control circuitry 220 includes a state machine 222, an on-chip address decoder 224, and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits. The one or more managing circuits perform the processes described herein.

Figure 4:
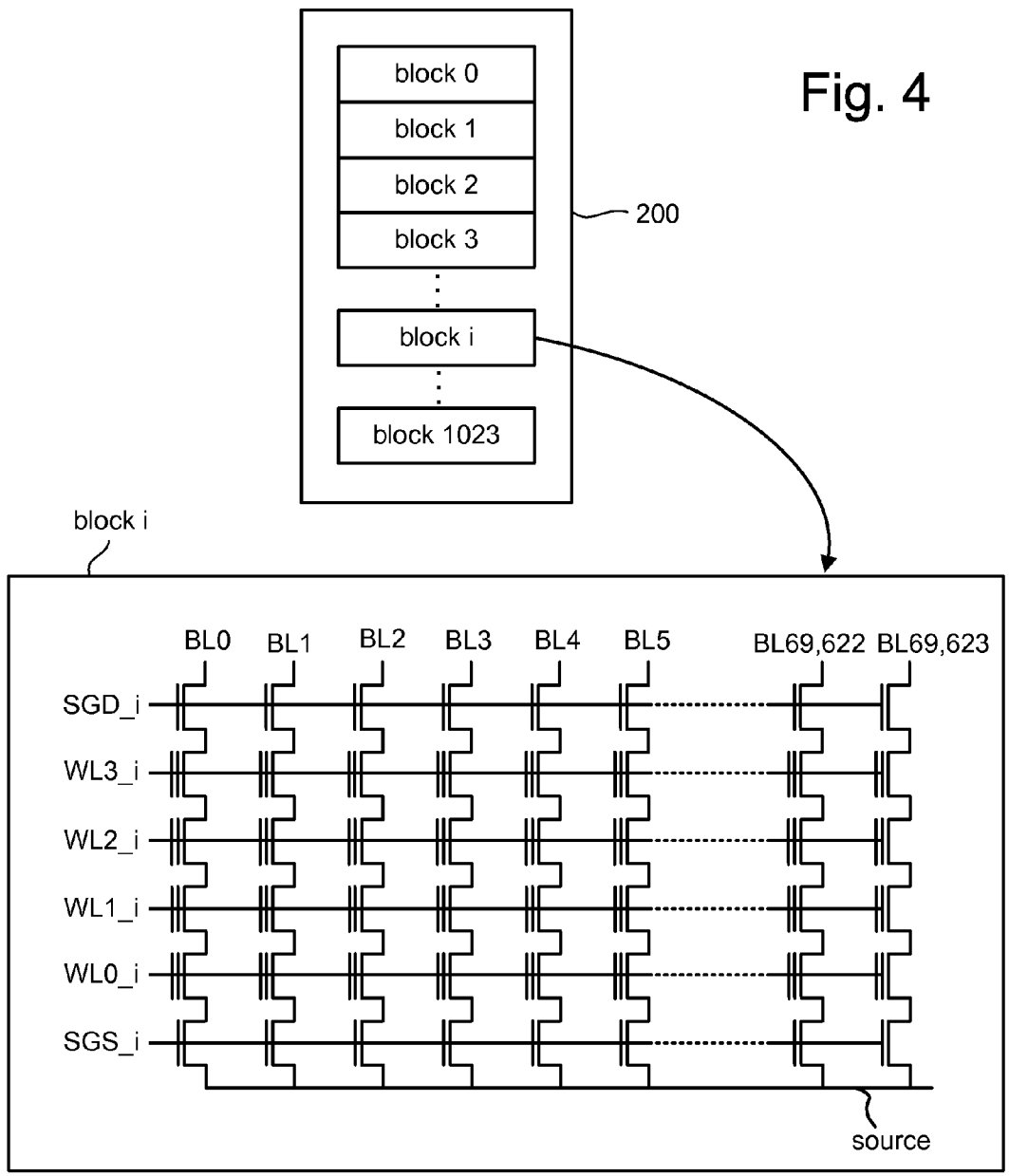
FIG. 4 is a block diagram depicting one embodiment of a memory array.

FIG. 4 depicts an exemplary structure of memory cell array 200. In one embodiment, the array of memory cells is divided into a large number of blocks (e.g., blocks 0-1023, or another amount) of memory cells. As is common for flash EEPROM systems, the block is the unit of erase. That is, each block contains the minimum number of memory cells that are erased together. Other units of erase can also be used.

A block contains a set of NAND strings which are accessed via bit lines (e.g., bit lines BL0-BL69,623) and word lines (WL0, WL1, WL2, WL3). FIG. 4 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. In one embodiment, a page is a unit of programming. Other units of programming can also be used. One or more pages of data are typically stored in one row of memory cells. For example, one or more pages of data may be stored in memory cells connected to a common word line. A page can store one or more sectors. A sector includes user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages and sectors can also be used.

Figure 5:
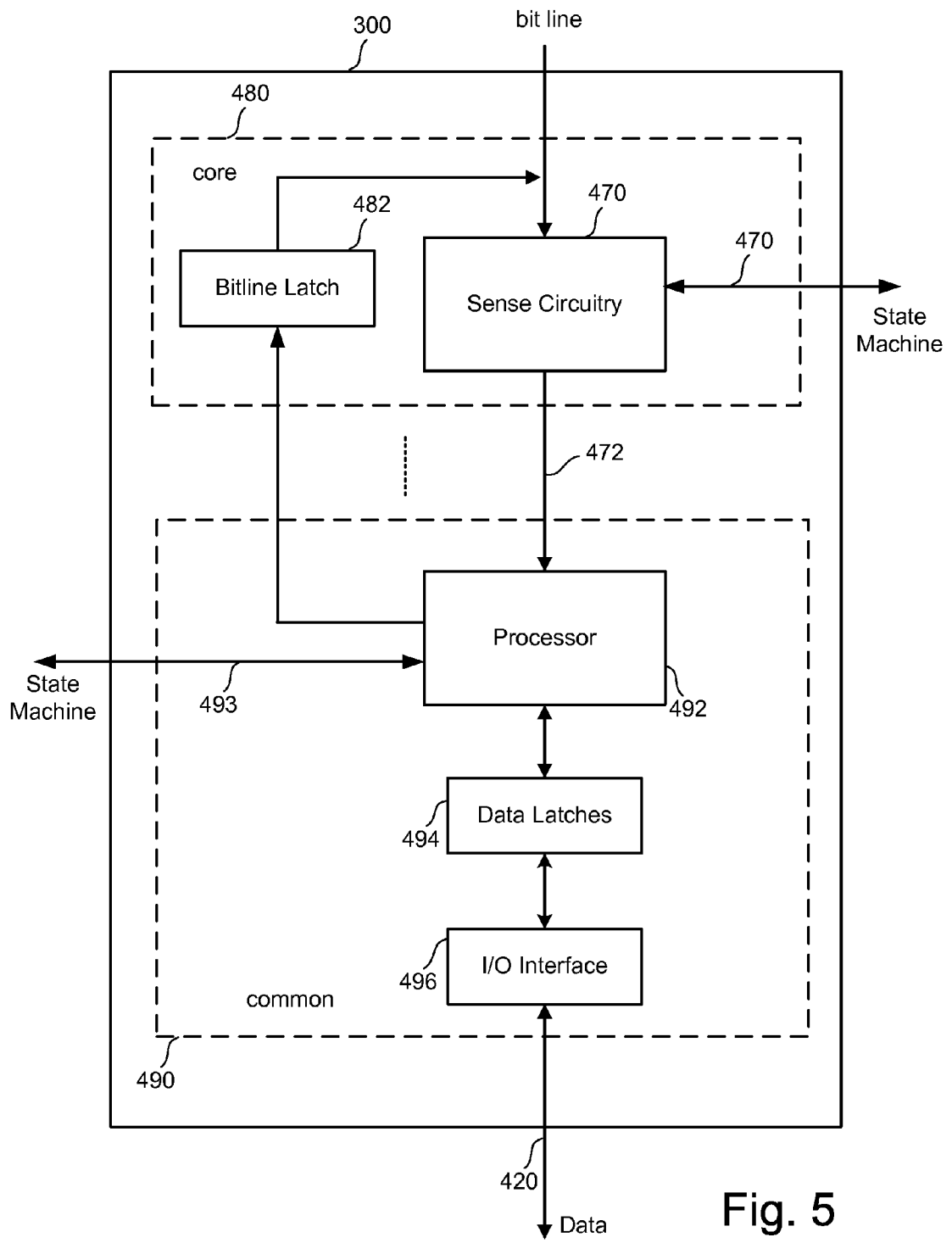
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. One example can be found in U.S. Patent Application Publication 2006/0140007, which is incorporated herein by reference in its entirety.

Sense module 480 comprises sense circuitry 470 that determines whether a conduction current in a connected bit line is above or below a predetermined level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls (using power control 226) the supply of different control gate voltages to the addressed memory cell(s). As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

Data latch stack 494 contains a stack of data latches corresponding to the sense module. In one embodiment, there are three (or four or another number) data latches per sense module 480. In one embodiment, the latches are each one bit.

During program or verify, the data to be programmed is stored in the set of data latches 494 from the data bus 420. During the verify process, Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the sensing operations and sense amplifiers can be found in (1) U.S. Patent Application Pub. No. 2004/0057287, "Non-Volatile Memory And Method With Reduced Source Line Bias Errors," published on Mar. 25, 2004; (2) U.S. Patent Application Pub No. 2004/0109357, "Non-Volatile Memory And Method with Improved Sensing," published on Jun. 10, 2004; (3) U.S. Patent Application Pub. No. 20050169082; (4) U.S. Patent Publication 2006/0221692, titled "Compensating for Coupling During Read Operations of Non-Volatile Memory," Inventor Jian Chen, filed on Apr. 5, 2005; and (5) U.S. Patent Application Publication No. 2006/0158947, titled "Reference Sense Amplifier For Non-Volatile Memory," Inventors Siu Lung Chan and Raul-Adrian Cernea, filed on Dec. 28, 2005. All five of the immediately above-listed patent documents are incorporated herein by reference in their entirety.

Figure 6:
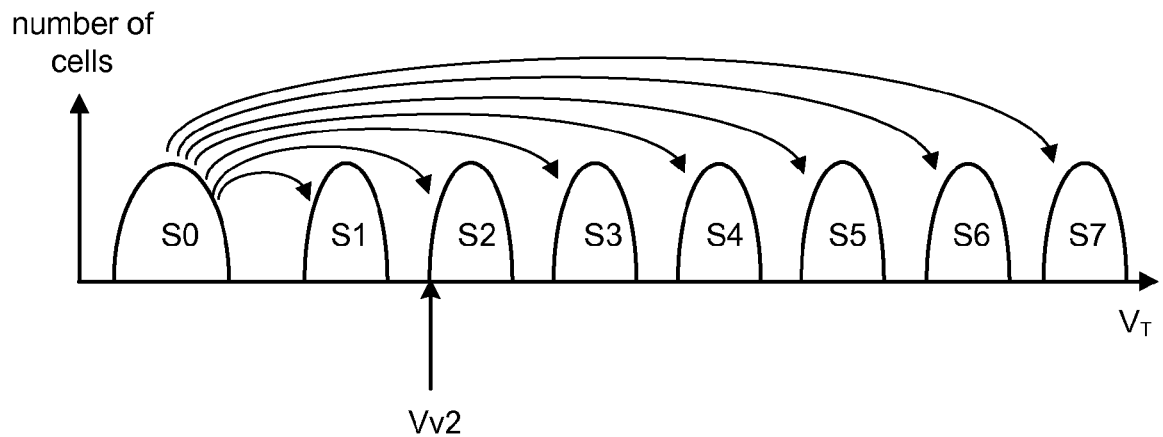
FIG. 6 depicts an example set of threshold voltage distributions.

At the end of a successful programming process (with verification), the threshold voltages of the memory cells should be within one or more distributions of threshold voltages for programmed memory cells or within a distribution of threshold voltages for erased memory cells, as appropriate. FIG. 6 illustrates example threshold voltage distributions (corresponding to data states) for the memory cell array when each memory cell stores three bits of data. Other embodiments, however, may use more or less than three bits of data per memory cell (e.g., such as two, or four or more bits of data per memory cell).

In the example of FIG. 6, each memory cell stores three bits of data; therefore, there are eight valid data states S0-S7 (each data state represented by a threshold voltage distribution depicted in FIG. 6). In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state corresponds to a unique value for the three bits stored in the memory cell. In one embodiment, S0=111, S1=110, S2=101, S3=100, S4=011, S5=010, S6=001 and S7=000. Other mapping of data to states S0-S7 can also be used. In one embodiment, all of the bits of data stored in a memory cell are stored in the same logical page. In other embodiments, each bit of data stored in a memory cell corresponds to a different logical page. Thus, a memory cell storing three bits of data would include data in a first page, a second page and a third page. In some embodiments, all of the memory cells connected to the same word line would store data in the same three pages of data. In some embodiments, the memory cells connected to a word line can be grouped into different sets of pages (e.g., by odd and even bit lines, or by other arrangements).

In some prior art devices, state 0 represents erased data. Therefore, the erase process causes the memory cells to move into state 0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 6. In other embodiments, the memory cells can be programmed using different processes. Examples of other types of programming process are found in U.S. Pat. No. 7,196,928, which is incorporated herein by reference in its entirety. No particular programming process is required for the erase and verification technology disclosed herein.

In one example of a programming process, memory cells are pre-programmed in order to maintain even wear on the memory cells. Memory cells are then erased (in blocks or other units). Soft programming can be performed to narrow the distribution of erased threshold voltages for the erased memory cells. Some memory cells may be in a deeper erased state than necessary as a result of the erase process. Soft programming can apply programming pulses to move the threshold voltage of the deeper erased memory cells closer to the erase verify level. After erasing and (optionally) soft programming, the memory cells of the block are programmed.

In general, when programming a NAND flash memory device, typically a program voltage is applied to the control gate of the selected memory cell and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique For Non-Volatile Memory," and in U.S. Patent Application Publication 2005/0024939, titled "Detecting Over Programmed Memory," both of which are incorporated herein by reference in their entirety. In many devices, the program voltage applied to the control gate during a program operation is applied as a series of voltage pulses (programming pulses) in which the magnitude of the programming pulses is increased by a predetermined step size for each successive pulse. Between programming pulses, a set of verify operations are performed in order to determine whether the selected memory cells have reached their target threshold voltage. Memory cells that have reached their target threshold voltage will be locked out from additional programming for that programming process.

After programming, the memory cells of the block can be read using processes known in the art, such as those described in U.S. Pat. No. 7,196,928 and U.S. Patent Publication 2007/0206426.

In general, during read and verify operations, the selected word line is connected to a voltage level which is specified for each read and verify operation in order to determine whether a threshold voltage of the concerned memory cell has reached such level. For example, when performing a verify operation to determine whether a memory cell has been properly programmed to states S2, Vv2 (see FIG. 6) can be connected to the selected word line. When attempting to read the data state of a memory cell, seven read operations can be performed such that each read operation includes applying a voltage between two neighboring data states. When performing a verify operation during an erase process where state S0 is below 0 volts and state S1 is above 0 volts, 0 volts can be connected to the selected word line. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that included the memory cell to discharge the corresponding bit line. The voltage on the bit line is measured after a period of time to see whether it has been discharged or not. Note that the technology described herein can be used with different methods known in the art for verifying/reading. More information about verifying/reading can be found in the following patent documents that are incorporated herein by reference in their entirety: (1) U.S. Patent Application Pub. No. 2004/0057287, "Non-Volatile Memory And Method With Reduced Source Line Bias Errors," published on Mar. 25, 2004; (2) U.S. Patent Application Pub No. 2004/0109357, "Non-Volatile Memory And Method with Improved Sensing," published on Jun. 10, 2004; (3) U.S. Patent Application Pub. No. 2005/0169082; and (4) U.S. Patent Publication 2006/0221692, titled "Compensating for Coupling During Read Operations of Non-Volatile Memory," Inventor Jian Chen, filed on Apr. 5, 2005.

Figure 7A:
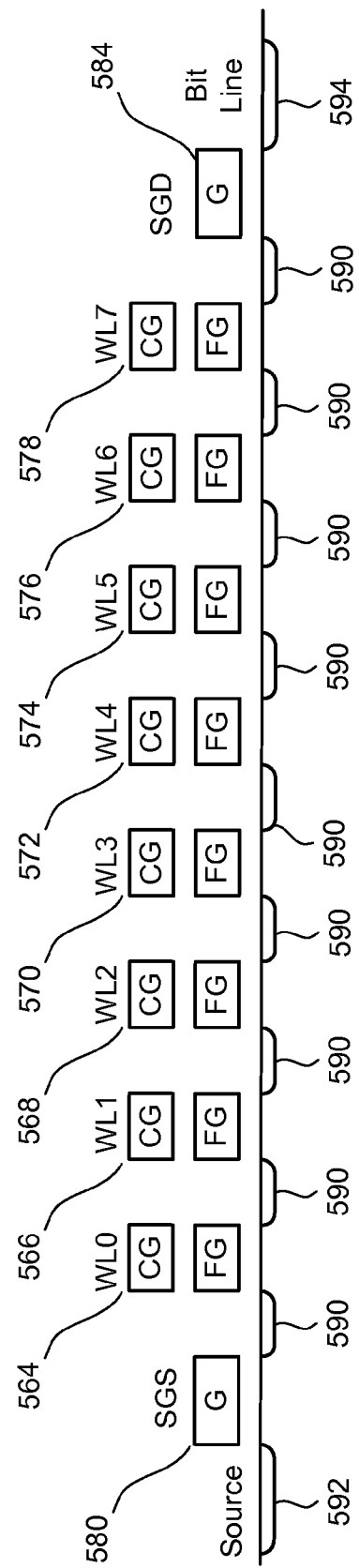
FIG. 7A depicts a cross section of a NAND string.

FIG. 7A shows a cross section of a NAND string and FIG. 7B shows bias conditions applied to the NAND string during read, erase, erase-verify and soft programming operations. The NAND string of FIG. 7A includes memory cells 564, 566, 568, 570, 572, 574, 576 and 578. Each of those memory cells includes a floating gate (FG) and a control gate (CG). The control gate for memory cell 564 is part of or connected to word line WL0. The control gate for memory cell 566 is part of or connected to word line WL1. The control gate for memory cell 568 is part of or connected to word line WL2. The control gate for memory cell 570 is part of or connected to word line WL3. The control date for memory cell 572 is part of or connected to word line WL4. The control gate for memory cell 574 is part of or connected to word line WL5. The control gate for memory cell 576 is part of or connected to word line WL6. The control gate for memory cell 578 is part of or connected to word line WL7. The NAND string also includes a drain side select gate 584 which receives a signal SGD at its gate. The drain side select gate allows for a selected connection to bit line 594. The NAND string also includes a source side select gate 580 that is used to selectively connect to source line 592. Select gate 580 receives a signal SGS at its gate. Each of these memory cells of the NAND string include source and drain regions defined by source/drain regions 590.

The second column of FIG. 7B shows the bias conditions used during a read operation. The select gates of the selected NAND string are biased to be in a conducting state, usually by applying a sufficiently high voltage, for example, a voltage Vsg which is in general higher than the power supply voltage Vdd. In one embodiment, Vsg is in the order of 4-4.5V. A sufficiently high overdrive voltage Vread (typically in the order of five to eight volts) is applied to the unselected word line to ensure that the unselected memory cells are in a conducting state, even when those memory cells have already been programmed. The selected word line (e.g. WL4 in FIG. 7B) receives Vcgrv, the read compare voltage. In the case of a binary read operation, typically zero volts is applied to the selected word line. If the memory cell has a threshold voltage less than zero volts, the memory cell will be in a conducting state and a sufficiently high read current can flow in the NAND string. If the memory cell was programmed such that its threshold voltage was greater than zero volts, no or a too low read current will flow.

A sense amplifier (discussed above) that is in communication with the bit line can be used to distinguish the high and low read current states. In the case of multi-level memory cells, multiple read operations can be performed with the voltage applied to the subject memory cell (e.g. WL4) being selected to distinguish between all the different memory states. In one embodiment, a bit line voltage is used to pre-charge the bit line (e.g. to 0.7 volts). If the memory cell selected for reading does conduct, that bit line voltage will dissipate based on the current flow from the bit line through the NAND string and to the source. At a predetermined time after applying the appropriate voltages, the bit line voltage or current can be sensed by the sense amplifier.

The third column of FIG. 7B shows the biasing used for conventional erase operations on a selected block of word lines. Memory cells are erased in one embodiment by raising the p-well to an erase voltage (e.g., 20 volts) for a sufficient period of time and grounding the word lines of a selected block while the source and bit lines are floating. The select gate lines SGS and SGD are also floating. In blocks that are not selected to be erased, word lines are floated. Due to capacitive coupling, the unselected word lines, bit lines, select lines, and the common source line are also raised to a significant fraction of the erase voltage thereby impeding erase on blocks that are not selected to be erased. In blocks that are selected to be erased, a strong electric field is applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of cells. In one embodiment, after erasing the memory cells, all of the erased memory cells will be in state S0 (see FIG. 6). One implementation of an erase process includes applying several erase pulses to the p-well and performing an erase-verify operation between erase pulses to determine whether the NAND strings are properly erased.

The fourth column of FIG. 7B shows the bias conditions for an erase-verify operation. An erase-verify operation can be carried out by applying a voltage Vdd (typically 1.8-3.3 volts) to the common source line while the select gates (SGS and SGD) are in a conducting state by applying the voltage Vsg to the select gates. In embodiments where the erase state (e.g., state S0) is below zero volts and the programmed state is above zero volts, the word lines are connected to a low voltage such as zero volts. When the threshold voltage of one or more of the memory cells of an NAND string is higher than zero volts, those memory cells are in a non-conducting state and no current can flow from the common source to the bit line. However, when all the memory cells have a threshold voltage lower than zero volts, a current can flow. Typically, the bit line is charged up with this current and the bit line voltage will increase to a certain level, for example 0.5-0.8 volts, depending on the threshold voltage of the memory cells and the time that is allowed to charge up the bit lines. The deeper the memory cells are erased, the higher the current and the higher the bit line voltage can get during a certain period of time. The erase-verify operation is done for all memory cells in a NAND string at the same time.

The fifth column of FIG. 7B shows the bias conditions for soft programming. The soft programming operation is typically carried out by applying soft programming pulses (Vspgm) to all word lines in a selected block at the same time. The soft programming pulses are at a lower amplitude than regular programming pulses to avoid the memory cells reaching a programmed state. After each soft programming pulse, a verify operation (similar to the erase-verify operation) is carried out. Soft programming continues (soft programming pulses plus verify) until a predetermined number of NAND strings in a selected block have reached a non-conducting state. This means that the threshold voltage distribution of the memory cells in the NAND string have shifted up close to the target level, even if a number of memory cells were originally over erased. During soft programming, the drain side select gate is biased to Vsgd (a voltage typical in the range of 1.8-3V but not necessarily equal to Vdd). Typically, the source is biased to 1-1.5V during programming and soft programming operations.

As can be seen from the above discussion with respect to FIGS. 7A and 7B, the read operation reads the memory cells one word line at a time while the erase-verify operation verifies the threshold voltages for all of the memory cells on all of the word lines in a selected block at the same time. Because all the word lines in a block are tested simultaneously during erase-verify, the erase-verify operation is much less time consuming than a read operation for all word lines.

During a read operation, the word lines corresponding to the unselected memory cells are biased with Vread and are thus in a highly conducting state while the selected memory cell is biased with a lower voltage and thus in a less conducting state. As a result, the I-V characteristics of the whole NAND string are mainly determined by the selected memory cell. On the other hand, because an erase-verify operation includes the application of the testing voltage (e.g., 0 volts or another level suitable for the particular implementation) to all of the word lines, the I-V characteristics of the NAND string will be affected by the properties of all of the memory cells as all memory cells in the NAND string are in a weakly conducting state (close to the threshold condition). As a result, even if the same testing voltage is applied, the current flowing through the NAND string with all word lines selected while be less than the current through a NAND string with only one word line selected (unselected word lines biased at Vread). Experimental results have also shown that the I-V characteristics of one memory cell are different from the I-V characteristics of the entire NAND string. To achieve the same current running through the NAND string, a NAND string with only one selected memory cell will need a lower word line voltage than a NAND string that has all memory cells biased with the same word line voltage. As such, a memory cell will experience different I-V characteristics during a read operation as compared to an erase-verify operation. After a verify operation passes, an individual memory cell will have a comparatively lower threshold voltage than the NAND string as a whole, which possibly results in a deeper than required erase threshold and, thus, has a negative influence on the endurance of memory cells. Further worsening this issue is that there is a trend to make NAND strings with more memory cells than in the past. As more memory cells are added to a NAND string, the resistance of the NAND string will increase. As such, the difference between individual memory cell's I-V characteristics and the entire NAND string's I-V characteristics will be augmented due to adding more memory cells to the NAND string.

One explanation for the above described differences between I-V characteristics of a single memory cell versus the entire NAND string is that when multiple memory cells are active, each one adds further resistance to the NAND string. Another component that causes differences in I-V characteristics is due to capacitive coupling of neighboring word lines. For example, if a particular word line WLn is selected for reading and Vread is applied to the neighboring word lines WLn−1 and WLn+1, then the voltage applied to the two neighboring word lines will capacitively couple to the floating gates connected to WLn. Assuming the selected word line is biased with Vcg and the neighboring word lines are biased with Vread, the threshold voltage of the selected memory cell can be derived by the following equation:

$$Vth = Vth\_neutral - 2\frac{Ccgn}{Ccg} \cdot Vread - \frac{Qfg}{Ccg}$$

where Qfg is charge stored in the floating gate connected to the selected word line, Vth_neutral is the neutral threshold voltage of the memory cell (no charge in the floating gate), Ccg is the capacitive coupling between the selected word line (WLn) and the floating gate on the selected word line, and Ccgn is the capacitive coupling between a neighboring word line (WLn−1 and WLn+1) and the floating gate on the selected word line. The factor 2*Ccgn/Ccg can have different values depending on parameters such as memory cell dimensions, spacing between the word lines, etc. In one embodiment, the factor is equal to approximately 0.15 such that a one volt increase in Vread results in a 0.15 volt apparent decrease in the memory cell threshold voltage. This corresponds to about a 0.9 volt decrease in memory cell threshold voltage, for a Vread of 6V, in comparison with the case where all the word lines are biases at about zero volts.

One solution to account for the differences in I-V characteristics experienced between read and erase-verify is by performing erase-verify on a single word line at a time. The word line selected for verify will receive the verify voltage (e.g. zero volts). The word lines that are not selected for verify will all receive Vread (or something similar). In this case, the I-V characteristics experienced for erase-verify will be closer to the I-V characteristics for read. One issue with the performing a read verify on a word line by word line basis is that there will be a performance degradation due to the extra time needed for erase-verify. If a NAND string has 64 memory cells, there will be 64 verify operations required when there used to be only one verify operation.

Another option is to perform erase-verify separately for odd word lines than for even word lines. When odd word lines are being verified, the odd word lines will receive verify compare voltage Vcgev (e.g. zero volts) and the even word lines will receive Vread. When even word lines are being verified, the even word lines will receive Vcgev and the odd word lines will receive Vread. Thus, only two verify operations will now be used to replace what used to be one verify operation. Although this is twice as many verify operations, it is still less verify operations than verifying each word line separately. Several implementations are possible for use with the above described odd/even erase-verify method. In a first embodiment, after each erase pulse, memory cells on all even word lines and memory cells on all odd word lines are separately verified such that there are two verify operations after each erase pulse (for binary)—one for odd word lines and one for even word lines. In a second embodiment, to reduce the required number of erase-verify operations, it is possible to carry out the erase-verify operations on only the even or only the odd word lines and assuming the other word lines are also erased in a similar way. This can reduce the number of required erase-verify operations, however it will not guarantee that all memory cells in a certain NAND string are all in an erased state. In a third embodiment, the erase-verify operation is performed for only the even word lines. After the erase-verify operation passes for only the even word lines, then the odd word lines can be tested and verified. Alternatively, the odd lines will be verified first and, when the odd lines are verified, the even word lines will be tested.

Note that in some cases, not all memory cells in a NAND string need to be successfully erased, since error detection (e.g. ECC) can be used to correct for a certain amount of insufficiently erased memory cells. One drawback of the embodiment of erase-verifying odd word lines separately from even word lines is that there is still a lot of word lines being operated on the same time. With a large number of word lines in a NAND string, the aggregate resistance can still be high thereby causing the I-V characteristics to be different during erase-verify as compared to a read operation.

Another option is to limit an erase-verify operation to a subset of even or a subset of odd word lines. For example, if there are 64 word lines, the word lines can be broken up into four (or more) subsets of even word lines and four (or more) subsets of odd word lines. In one embodiment, after each erase pulse, each of the subsets are separately verified. In other embodiments, only one subset is verified and used as a representative subset for all the other subsets. In yet another embodiment, the system will only attempt to verify the one representative subset between erase pulses until the representative subset verifies. After that, all subsets will then be verified to make sure the entire block is verified appropriately. In the above example, the subset of memory cells being verified will be receiving Vcgev and all the other memory cells will be receiving Vread. For example, if one subset of odd word lines are being verified, then those odd word lines (e.g. WL1, 3, 5, 7, 9, 11, 13, 15) will receive Vcgev and all other remaining word lines will receive Vread.

Another option is to separately verify overlapping contiguous groups of memory cells. That is, the NAND string is broken up into groups of contiguous memory cells. By contiguous, it is meant that the memory cells are next to each other. For example, looking back at FIG. 7A, memory cells 564, 566, 568 and 570 are a group of contiguous memory cells. On the other hand, a group that consisted only of memory cells 570 and 576 would not be contiguous. The groups are overlapping, meaning that a first group will have a memory cell that is in common with the second group. For example, looking back at FIG. 7A, contiguous group one consisting of memory cells 564, 566, 568, 570, 572 is overlapping with contiguous group two which includes memory cells 570, 572, 574, 576 and 578 because both groups include memory cells 570 and 572.

One reason for having the groups overlap is to ensure that all memory cells have the same bias condition during at least one verify operation. For example, when group one is being verified, the memory cells of group one (564, 566, 568, 570, 572) will all be receiving Vcgev while the remaining memory cells will be receiving Vread. This means that memory cell 572 will have a neighbor at Vread and, thus, may be subjected to capacitive coupling while the other memory cells of group one will not have a neighbor in Vread. When group two is being subjected to verification, memory cells 570-578 will be receiving Vcgev while memory cells not in group two will be receiving Vread. Therefore, memory cell 572 will not have a neighbor receiving Vread when group two is being verified. As such, memory cell 572 will be verified appropriately during the verification process for group two. In such an embodiment, memory cell 572 will be subjected to verification twice.

Several implementations are possible using the erase-verify method which separately verifies overlapping and contiguous groups of word lines/memory cells. In one embodiment, after each erase pulse, all subsets of word lines are verified. For example, after each erase pulse a first subset is verified, followed by a second subset being verified, followed by a third subset being verified, etc. In another embodiment, one subset is verified after each erase pulse and used as a representative subset for all memory cells. In a third embodiment, after each erase pulse, only the representative subset will be verified. When that representative subset successfully verifies, then all other subsets will then be verified for that pulse and subsequent pulses until all subsets are verified.

Note that in some cases, not all memory cells in the NAND string need to be successfully erased. Error correction (e.g. ECC) can be used to correct for a certain amount of insufficiently erased memory cells or other types of errors.

Another solution for performing erase-verify is to verify different contiguous groups of word lines, with each group of word lines using a different testing signal for word lines at the edge of the group than for word lines not at the edges of the group. For example, looking back at FIG. 7A and considering one group to be memory cells 466, 468, 470, 472 and 474, a different Vcgev would be applied to memory cells 466 and 474, then applied to memory cells 468, 479 and 472. The word lines outside the group selected for verify will receive Vread.

As discussed above, when a neighbor is receiving Vread, a portion of that Vread voltage is coupled to the word line selected for verify. Thus, to compensate for a neighbor receiving Vread, the word line next to a word line receiving Vread can utilize a lower Vcgev at its control gate. Consider that the neighbor word line receiving Vread tends to increase the voltage experienced at the floating gate of the selected memory cell. Lowering the Vcgev for the selected memory cell will tend to lower the voltage experienced at the floating gate of the selected memory cell thereby causing the floating gate of the selected memory cell to experience the desired voltage. The memory cells at the edge of a group have a neighbor receiving Vread and, thus, will be compensated by having a lower Vcgev. The memory cells in the middle of the group do not need such compensation and will have the higher Vcgev. With this scheme, all memory cells in the group will verify to the approximately the same threshold voltage level. This scheme can also be performed in three different embodiments. In the first embodiment, after each erase pulse, every group is separately verified. In the second embodiment, only one representative group is verified. In the third embodiment, the system starts out only verifying the one representative group until that representative group verifies. After the representative group verifies and for all subsequent erase pulses, all groups of memory cells will be verified.

Figure 8:
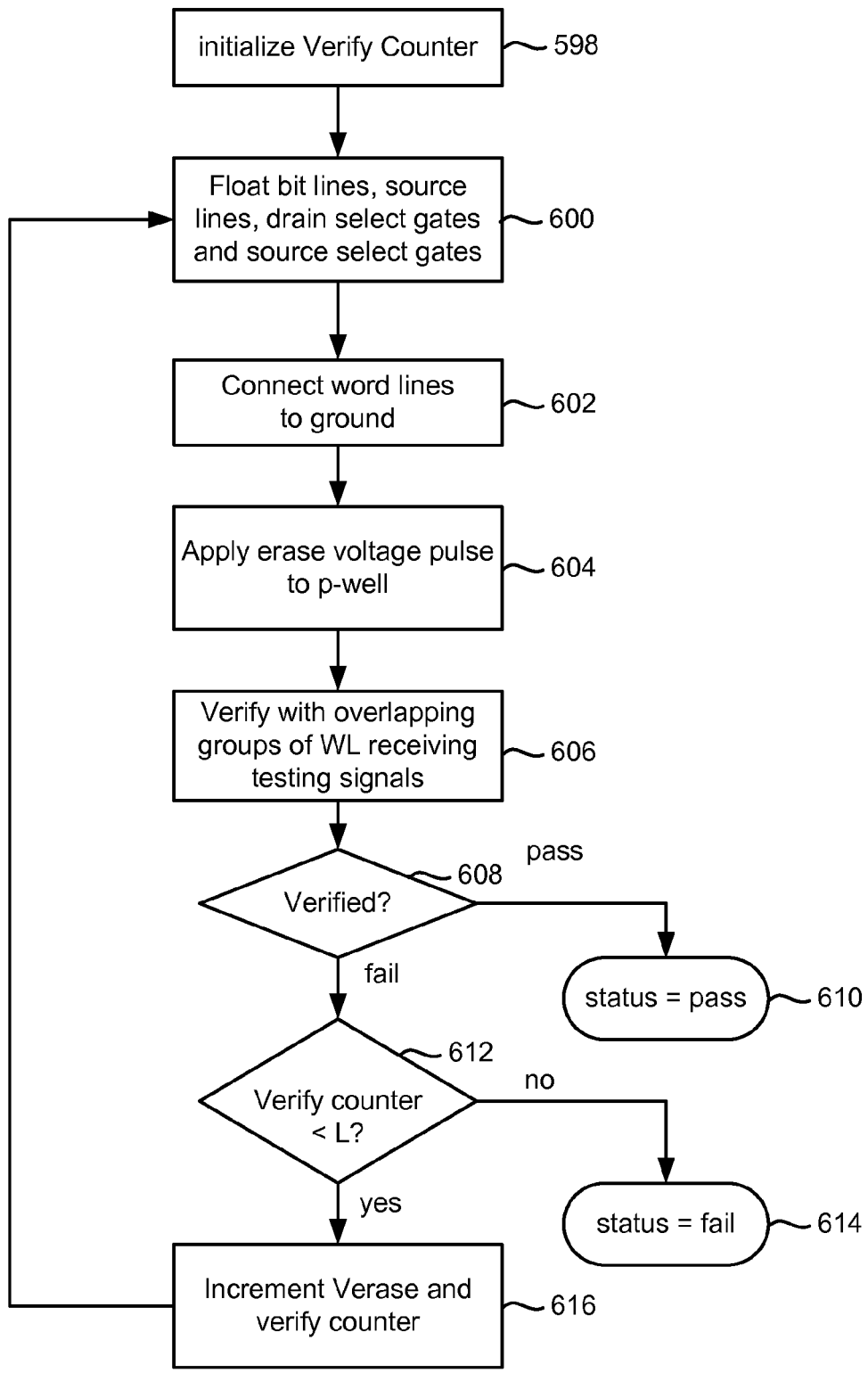
FIG. 8 is a flow chart describing one embodiment of a process for erasing non-volatile storage.

FIGS. 8-12 provide more details of the embodiments for performing erase-verify that separately verify overlapping and contiguous groups of word lines/memory cells. More specifically, FIG. 8 is a flow chart describing one embodiment of a process for erasing nonvolatile storage. In step 598, a verify counter is initialized to zero (or another number). In step 600, the system will float the bit lines, source lines, drain select lines (SGD) and source select lines (SGS). In step 602, all of the word lines of the block being erased are connected to ground. In other embodiments, different units of erase can be utilized. In step 604, the erase voltage is applied as a pulse to the p-well. In one embodiment, various signals applied in step 602-604 are provided by power control 226 at the direction of state machine 222. Memory cells, in one embodiment, are erased by raising the p-well to an erase voltage (e.g., 16 volts) for a sufficient period of time and grounding the word lines of the selected block as discussed above. A strong electric field is thus applied to the tunnel oxide layers of the memory cells. Electrons in the floating gates are emitted to the p-well, typically by a Fowler-Nordheim tunneling mechanism. As electrons are transferred from the floating gate to the p-well region, the threshold voltage of a selected memory cell is lowered. Erasing can be performed on the entire memory array, on individual blocks, or other units of memory cells.

In step 606 of FIG. 8, one or more verify operations are performed on overlapping and contiguous groups of word lines. In step 608, it is determined whether the block of memory cells has sufficiently verified. If the block of memory cells has sufficiently verified, then the erase process has completed successfully (step 610). If the block of memory cells is not sufficiently verified, then at step 612, it is determined whether a verify counter is less than a verify limit L (e.g., 8). If the verify counter is not less than the verify limit L, then the erase process has failed (step 614). If the verify counter is less than verify limit L, then in step 616 the verify counter is incremented. Additionally, the magnitude of the erase pulse is incremented and the process loops back to step 600 and prepares to apply another erase pulse. In one embodiment, the first erase pulse is 16 volts and subsequent erase pulses are increase by a preset increment value (e.g., 0.5-1.0 volts). Note that the order of steps in FIG. 8 can vary.

Figure 9:
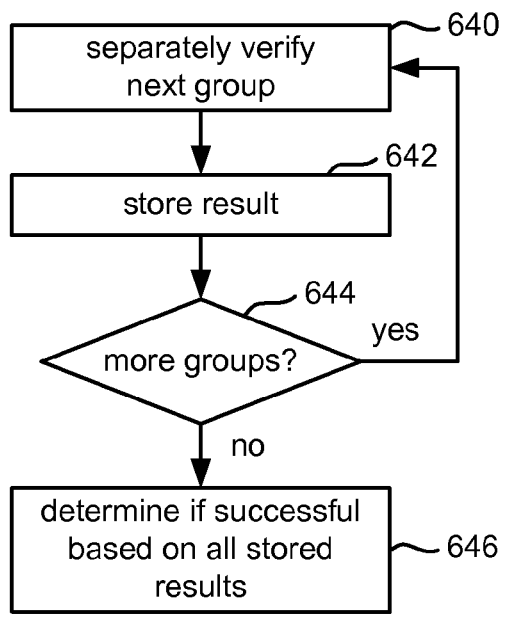
FIG. 9 is a flow chart describing one embodiment of a process for verifying non-volatile storage.

FIG. 9 is a flow chart describing one embodiment of the process for verifying overlapping and contiguous groups of word lines using one or more test signals (see step 606 of FIG. 8). In step 640, the next group to be verified is separately verified using one or more test signals. After separately verifying the next group, the result is stored in step 642. If there are more groups to verify (see step 644), then the process loops back to step 640 and separately verifies the next group. If all the groups that are to be verified have been verified, then at step 646 the system determines whether the verification process was successful based on all (or a subset) of the stored results. If every group verified and every iteration of step 640 had a successful result, then the entire verify process is successful. Note that in one embodiment, the groups are verified sequentially; however, in other embodiments other orders can be implemented. In one embodiment, if one of the groups fails verification, the process of FIG. 9 can be terminated.

Figure 10:
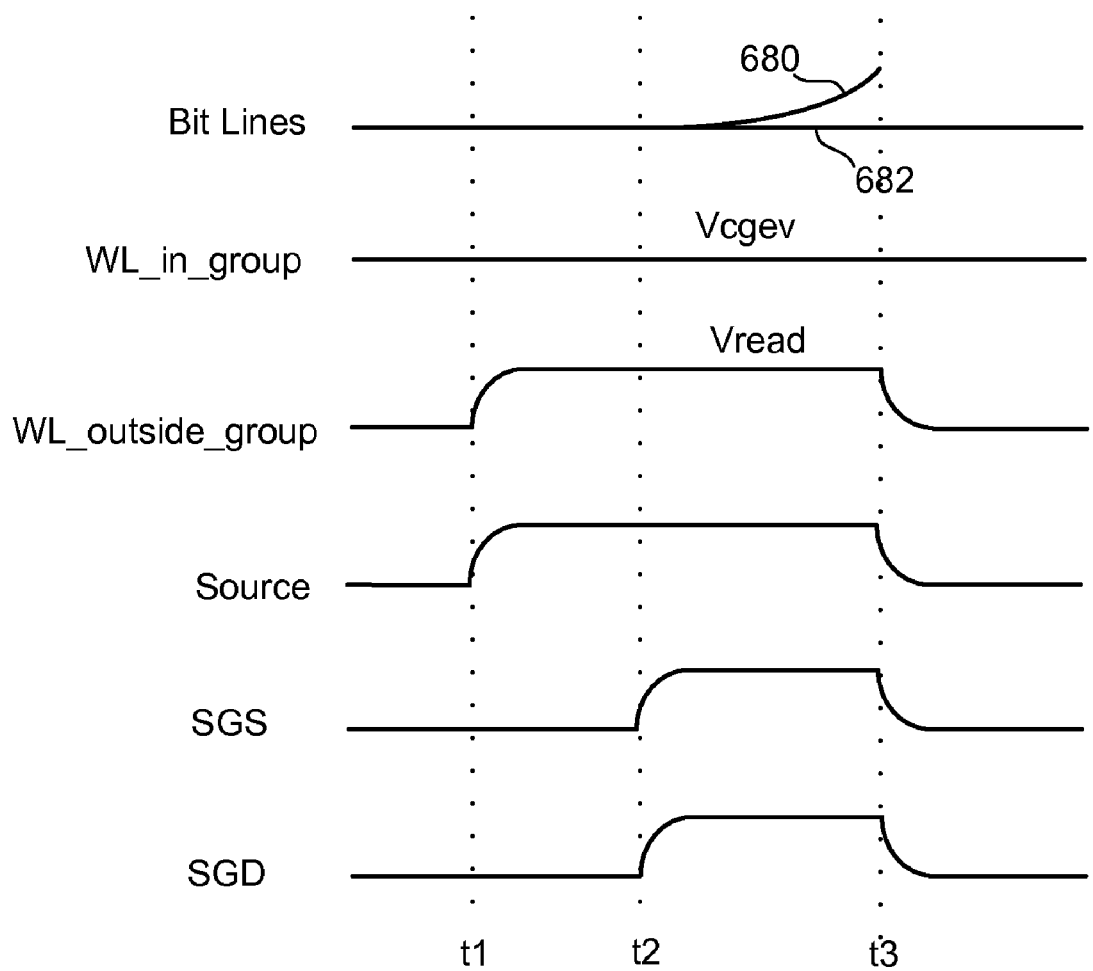
FIG. 10 is a signal diagram that describes a verify operation for non-volatile storage.

FIG. 10 is a signal diagram depicting a process for separately verifying a group of memory cells (see step 640 of FIG. 9). FIG. 10 shows voltage levels to the bit lines, word lines in the group, word lines outside the group being verified, source side select gate (SGS), source, drain side select gate (SGD). Word lines within the group being separately verified receive Vcgev. In the embodiment, Vcgev=0 volts. Other values can also be used. Word lines that are not within the group being separately verified are driven to Vread at t1 and remain at Vread until t3. The source line is driven to Vdd at t1 and remains at Vdd until t3. At t2 the select gates are turned on by applying Vsg to SGS and SGD. If all the memory cells within the group being verified have threshold voltages below Vcgev, then they will turn on and conduct current, causing the bit line voltage to slowly rise as depicted by curve 680. If one or more of the memory cells have a threshold voltage above the Vcgev, then current will not flow and the voltage will remain at zero, as depicted by line 682. The condition of the bit line(s) would be sampled sometime after t2 and prior to t3. This voltage condition would be indicative of the threshold voltage conditions of the memory cells connected to the word lines that are part of the group being verified.

Although FIG. 10 shows the same Vcgev being applied to all word lines in the group, in some embodiments Vcgev could be varied for the word lines in the group. Similarly, different Vread levels can be applied to word lines not in the group.

FIG. 11 is a table which depicts sets of overlapping and contiguous groups of word lines, and the memory cells connected to those word lines, and the signals they receive for each iteration of step 640. In one embodiment, a block of memory cells will include 66 word lines such that 64 word lines are used for data and two word lines are dummy word lines used to provide appropriate bias conditions and/or store other information. FIG. 11 only shows a portion of those 64 word lines. However, the teaching of FIG. 11 can be interpolated for the word lines that are not depicted. Alternatively, the teaching of FIG. 11 can be used for a system with less than or more than 66 word lines. The second column of FIG. 11 shows a verify operation for a first group of word lines/memory cells corresponding to WL0-WL4. The second column shows a verify operation for a second group of word lines/memory cells corresponding to WL3-WL8. Note that the word lines in the group are contiguous because they are neighbors. The groups are overlapping because group one includes memory cells connected to WL3 and WL4, and group two also includes memory cells connected to WL3 and WL4. Thus, the memory cells connected to WL3 and WL4 will be verified twice, although at different bias conditions. The fourth column of FIG. 11 shows a verify operation for a third group of word lines/memory cells corresponding to WL7-WL12. Note that memory cells connected to WL7 and WL8 appear in both group two and group three. Thus, the memory cells connected to WL7 and WL8 will be verified twice, although at different bias conditions. The fifth column of FIG. 11 shows a verify operation for a fourth group of word lines/memory cells corresponding to WL11-WL16, with memory cells connected to WL11 and WL12 being members of groups three and four. Thus, during the first iteration of step 640, memory cells connected to word lines WL0-WL4 will be verified. In the second iteration of step 640, memory cells connected to word lines WL3-WL8 will be verified. In the third iteration of step 640, memory cells connected to word lines WL7-WL12 will be verified. In the fourth iteration of step 640, memory cells connected to word lines WL11-WL16 will be verified, and so on. As explained with respect to FIG. 8, the process of FIG. 9 is performed after each erase pulse.

Figure 12:
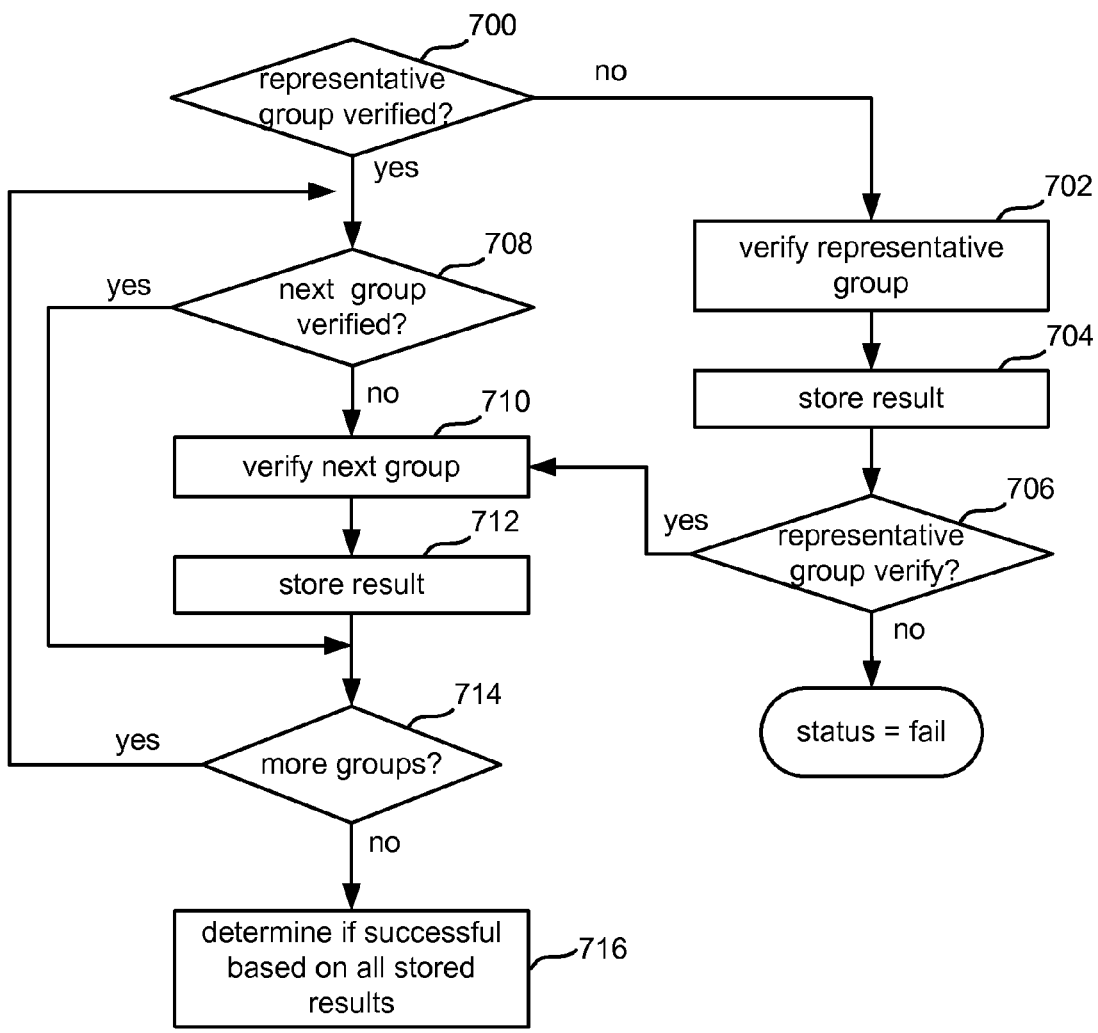
FIG. 12 is a flow chart describing one embodiment of a process for verifying non-volatile storage.

FIG. 12 provides another embodiment where, initially, only one group is verified after each erase pulse. Subsequent to that one group being successfully verified, then the other groups are verified. Once a group successfully verifies, it is not tested again for that erase sequence (e.g., the process of FIG. 8). The process of FIG. 12 can be performed after each erase pulse of the current erase cycle, for example, in step 606 of FIG. 8. In step 700, the system determines whether the representative group of memory cells has already been successfully verified. If not, a verify operation is performed for that representative group in step 702 using the process described with respect to FIG. 10. The result is stored in step 704. In one embodiment, the representative group of memory cells is any of the groups of overlapping and contiguous memory cells. In another embodiment, instead of one representative group of memory cells being verified first, multiple representative groups (but less than all groups) of memory cells being verified first in step 702. If the verification operation of step 702 determines that the representative group did not successfully verify (step 706), then the verify process of FIG. 12 is terminated as unsuccessful.

If the representative group has verified successfully (step 706), then the remainder of the groups need to be verified. The process continues at step 710, in which the next group is verified. In step 712, the results of step 710 are stored. If there are more groups to verify (step 714), then the process continues at step 708. If all of the groups have been processed (step 714), then in step 716 it is determined, based on the stored results, whether the set of memory cells have verified successfully. In one embodiment, the set of memory cells have verified successfully if all groups verified successfully.

In step 700, if the representative group has already successfully verified, then the verify process seeks to process the other groups. However, any group that has already been successfully verified need not be verified again. Therefore, step 708 determines whether the next group to be processed has already successfully verified. If so, that group is skipped and the process moves on to the next group (step 714). If the next group to be processed has not already successfully verified, then a verification operation is performed for that group in step 710.

Figure 12A:
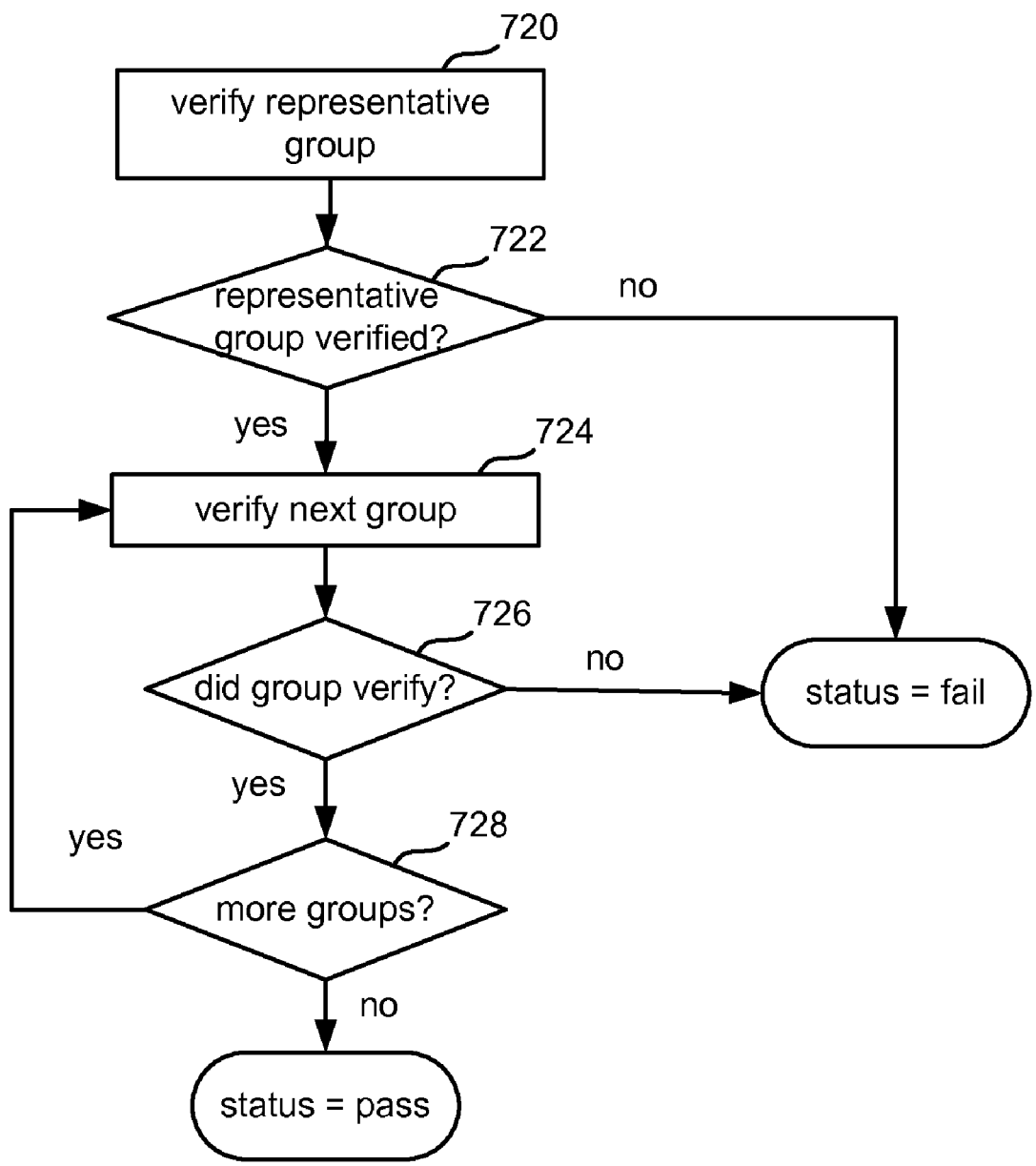
FIG. 12A is a flow chart describing one embodiment of a process for verifying non-volatile storage.

FIG. 12A provides another embodiment where the representative group is verified after each erase pulse. If that representative group is successfully verified, then the other groups are verified. The process of FIG. 12A can be performed after each erase pulse, for example, in step 606 of FIG. 8. In step 720 of FIG. 12A, a verify operation is performed on the representative group. If the verification operation of step 720 determines that the representative group did not successfully verify (step 722), then the verify process of FIG. 12A is terminated as unsuccessful.

If the representative group has verified successfully (step 722), then the remainder of the groups need to be verified. In step 724, the next group is verified. If that group verified in the current iteration of step 724 does not successfully verify (step 726), then the verify process of FIG. 12A is terminated as unsuccessful. If that group verified in the current iteration of step 724 does successfully verify (step 726), then it is determined whether there are more groups that need to be tested (step 728). If there are more groups to test, then the process loops back to step 724 and the next group is tested. If there are no more groups to test, then that means that all groups successfully verified; therefore, the verification process of FIG. 12A was successful. As described above, the process of FIG. 12A will verify up to all of the groups until one group is unsuccessful or all groups are successful.

Figure 13:
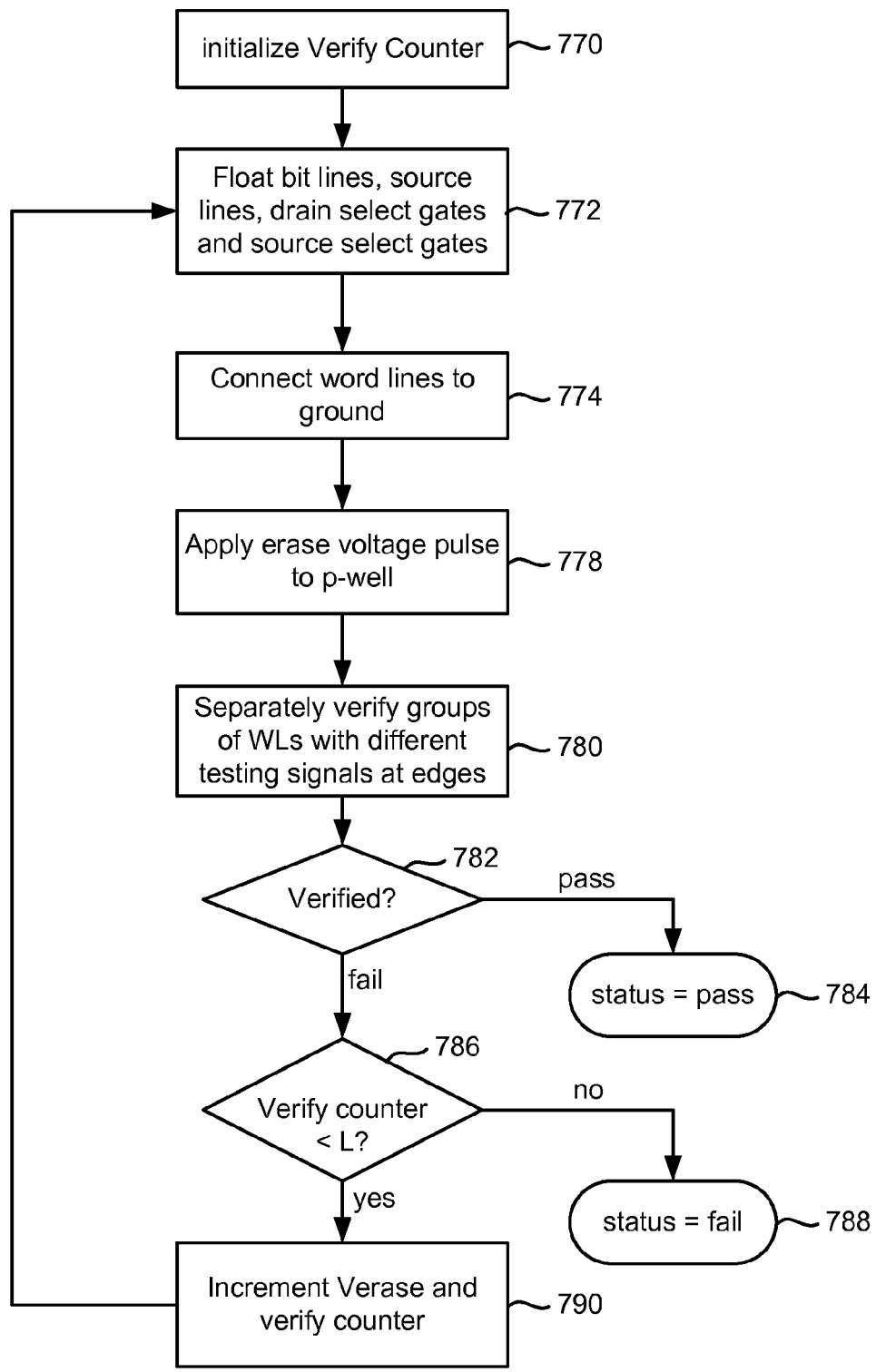
FIG. 13 is a flow chart describing one embodiment of a process for erasing non-volatile storage.

FIGS. 13-15 describe the embodiment that separately verifies groups of word lines with different testing signals being provided to memory cells at the edges of the groups as compared to the one or more testing signals provided to memory cells that are not at the edges of the groups. In step 770, the verify counter is initialized. In step 772, the bit lines, source lines, drain select gate lines, and source select gate lines are floated. In step 774, the word lines of the selected block (or other unit) are connected to ground. In step 778, an erase voltage pulse is applied to the p-well. In step 780, the verification process is performed separately for different groups of word lines with different testing signals being used at the edges, as explained above. If all the groups are verified (step 782), then the erase process has completed successfully (step 784). If the verification failed, then it is determined whether the verify counter is below a preset limit L (step 786). If the verify counter is greater than the preset limit L, then the erase process ends as a failure (step 788). If the verify counter is below the limit L, then in step 700, the verify counter is incremented by one and the erase pulse magnitude is incremented by a step size. In some embodiments, the erase pulse can remain at the same magnitude. After step 790, the process loops back to step 772. Note that in some embodiments of step 782, the verification process will be considered successful if less than a predetermined number of groups or memory cells fail because some errors can be addressed with ECC.

In one embodiment, the process of FIG. 9 can be used to perform the step of separately verifying groups (step 780 of FIG. 13). In another embodiment, the process of FIG. 12 can be used to perform step 780. Alternatively, the process of FIG. 9 or FIG. 12 can be used with processes other than FIG. 13. Alternatively, processes other than FIG. 9 or FIG. 12 can be used to implement step 780. Note that the order of steps in FIG. 13 can vary.

FIG. 14 is a signal diagram depicting a verify operation, which can be used to implement step 640 of FIG. 9 or steps 702 or 706 of FIG. 12 when the processes of FIG. 9 or 12 are used to implement step 780 of FIG. 13. FIG. 14 shows voltage levels for bit lines, word lines internal to the group, word lines on the edge of the group, word lines outside the group, source line, source side select gate signal SGS and drain side select gate signal SGD. Word lines internal to the group (in the group and not at an edge of the group) receive Vcgev. Word lines at the edge of a group receive Vedge. In one embodiment, Vedge is less than Vcgev. The difference between Vcgev and Vedge depends on the magnitude of Vcgev, Vread and device characteristics, in particular the amount of parasitic coupling of the floating gate of memory cells on the selected word line with the neighboring word lines as explained above. In one embodiment, simulation or device testing can be used to determined Vedge. Word lines that are not in the group receive Vread at t1 until t3. The source line is raised to Vdd at t1. The select gates are turned on by asserting Vsg to SGS and SGD at t2. Assuming that Vedge is optimized correctly, if all of the memory cells connected to the word lines in the group have their threshold voltages less than Vcgev then a current will flow through the NAND string and the voltage on the bit line will rise as depicted by curve 810. If any of the memory cells on these word lines have a threshold voltage higher than Vcgev, then no or insufficient current will flow through the NAND string and the voltage will remain constant (e.g. at zero volts) or almost constant as depicted by straight line 812. The condition of the bit line(s) would be sampled sometime after t2 and prior to t3. This voltage condition would be indicative of the threshold voltage conditions of the memory cells connected to the word lines that are part of the group being verified.

Although FIG. 14 shows the same Vcgev being applied to all internal word lines in the group, in some embodiments Vcgev could be varied for the internal word lines. Similarly, different Vread levels can be applied to word lines not in the group.

FIG. 15 depicts the various groups erased and verified as part of the process of FIG. 13. The second column of FIG. 15 shows a first group that includes word lines WL0-WL4 and the connected memory cells receiving testing signals. There is only one word line at the edge, WL4, which receives Vedge. The other word lines receive Vcgev. The third column of FIG. 15 shows the second group, which includes WL5-WL9 and the connected memory cells, receiving testing signals. Word lines WL5 and WL9 are at the edge and receive Vedge. The internal word lines WL6-WL8 receive Vcgev. The fourth column of FIG. 15 shows the third group, which includes WL10-WL14 and the connected memory cells, receiving testing signals. WL10 and WL14 are at the edge and receive Vedge. Word lines WL11-WL13 receive Vcgev. The fifth column of FIG. 15 shows a fourth group, which includes WL14-WL19 and the connected memory cells, receiving testing signals. The word lines at the edge include WL15 and WL19, and receive Vedge. The word lines not at the edge (WL16-WL18) receive Vcgev, and so on. Thus, during the first iteration of step 640, for this embodiment, word lines WL0-WL4 will be verified. During the second iteration of step 640, for this embodiment, word lines WL5-WL10 will be verified. During the third iteration of step 640, for this embodiment, word lines WL10-WL14 are verified, and so on. Note that the sequence of verifying groups can vary from those depicted in FIG. 15.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage apparatus, comprising:
   a plurality of non-volatile storage elements; and
   one or more managing circuits in communication with the plurality of non-volatile storage elements, the one or more managing circuits perform a particular erase function on a set of non-volatile storage elements and separately perform verification for different overlapping and contiguous subsets of the non-volatile storage elements in response to the particular erase function.

2. The non-volatile storage apparatus according to claim 1, wherein:
the one or more managing circuits separately perform verification for different overlapping contiguous subsets of the non-volatile storage elements in response to the particular erase function by applying multiple sets of testing signals, at different times, to the overlapping and contiguous subsets of non-volatile storage devices and, at the different times and in response to the testing signals, sensing condition information of non-volatile storage elements receiving the testing signals.

3. The non-volatile storage apparatus according to claim 2, wherein:
the testing signals are at a common voltage.

4. The non-volatile storage apparatus according to claim 2, wherein:
the one or more managing circuits apply overdrive signals, while applying the testing signals, to non-volatile storage elements not in respective subsets.

5. The non-volatile storage apparatus according to claim 1, wherein:
the particular erase function is an erase pulse; and
the one or more managing circuits separately perform verification for different overlapping and contiguous subsets of the non-volatile storage elements in response to the particular erase function by verifying twice for a particular erase pulse those non-volatile storage elements in multiple subsets.

6. The non-volatile storage apparatus according to claim 1, wherein:
the one or more managing circuits separately perform verification for different overlapping and contiguous subsets of the non-volatile storage elements in response to the particular erase function by applying one or more testing signals to a first subset of non-volatile storage elements, sensing condition information for the first subset of non-volatile storage elements, applying one or more testing signals to a second subset of non-volatile storage elements that overlaps with the first subset of non-volatile storage elements and sensing condition information for the second subset of connected non-volatile storage elements.

7. The non-volatile storage apparatus according to claim 6, further comprising:
word lines connected to the non-volatile storage elements, the non-volatile storage elements are NAND flash memory devices arranged on NAND strings, the first subset and the second subset include portions of common NAND strings, and the testing signals are applied to word lines connected to the NAND strings.

8. The non-volatile storage apparatus according to claim 1, wherein:
the non-volatile storage elements are NAND flash memory devices arranged on a NAND string.

9. The non-volatile storage apparatus according to claim 1, wherein:
the one or more managing circuits separately perform verification for different overlapping and contiguous subsets of the non-volatile storage elements in response to the particular erase function by sequentially verifying all overlapping and contiguous subsets of the non-volatile storage elements after and in response to the particular erase function.

10. The non-volatile storage apparatus according to claim 1, wherein:
the one or more managing circuits perform multiple erase operations on the set of non-volatile storage elements and perform verification on less than all of the subsets of non-volatile storage elements after each of the erase operations, the performing multiple erase operations and the performing verification on less than all of the subsets of non-volatile storage elements after each of the erase functions are performed prior to the particular erase function.

11. A non-volatile storage apparatus, comprising:
a plurality of non-volatile storage elements; and
one or more managing circuits in communication with the plurality of non-volatile storage elements;
the one or more managing circuits apply one or more testing signals to a first contiguous and connected group of non-volatile storage elements, sense condition information for the first contiguous and connected group of non-volatile storage elements in response to the one or more testing signals applied to the first contiguous and connected group of non-volatile storage elements, apply one or more testing signals to a second contiguous and connected group of non-volatile storage elements that overlaps with the first contiguous and connected group of non-volatile storage elements, and sense condition information for the second contiguous and connected group of connected non-volatile storage elements in response to the one or more testing signals applied to the second contiguous and connected group of non-volatile storage elements.

12. The non-volatile storage apparatus according to claim 11, wherein:
the first contiguous and connected group of non-volatile storage elements and the second contiguous and connected group of non-volatile storage elements are NAND flash memory devices arranged on NAND strings;
the non-volatile storage apparatus further comprises word lines connected to the NAND strings;
the testing signals and the overdrive signals are applied to word lines connected to the NAND strings;
a particular non-volatile storage element is in the first contiguous and connected group of non-volatile storage elements and the second contiguous and connected group of non-volatile storage elements;
the one or more managing circuits sense the particular non-volatile storage element when sensing the condition information for the first contiguous and connected group of non-volatile storage elements and when sensing condition information for the second contiguous and connected group of non-volatile storage; and
the one or more managing circuits apply an erase signal to the first contiguous and connected group of non-volatile storage elements and the second contiguous and connected group of non-volatile storage elements, the sensing condition information for the first contiguous and connected group of non-volatile storage elements and the sensing condition information for the second contiguous and connected group of connected non-volatile storage elements are performed separately to test whether the erase signal achieved a successful erase condition in the first contiguous and connected group of non-volatile storage elements and the second contiguous and connected group of non-volatile storage elements.

13. A non-volatile storage apparatus, comprising:
a plurality of non-volatile storage elements; and one or more managing circuits in communication with the plurality of non-volatile storage elements, the one or more managing circuits apply multiple sets of testing signals at different times to overlapping and contiguous subsets of non-volatile storage devices, the one or more managing circuits sense condition information of non-volatile storage elements receiving the testing signals, the one or more managing circuits perform the sensing at the different times and in response to the testing signals.

14. The non-volatile storage apparatus according to claim 13, wherein:
the one or more managing circuits perform an erase function on the plurality of non-volatile storage elements; and
the sensing is performed in order to verify the erase function.

15. The non-volatile storage apparatus according to claim 13, wherein:
the one or more managing circuits apply a set of erase signals to the non-volatile storage elements; and
the one or more managing circuits apply the multiple sets of testing signals after each erase signal.

16. The non-volatile storage apparatus according to claim 13, wherein:
the one or more managing circuits apply a first set of erase signals and a second set of erase signals to the non-volatile storage elements;
the one or more managing circuits attempt to verify less then all subsets of the overlapping and contiguous subsets of non-volatile storage devices after each erase signal of the first set of erase signals; and
the one or more managing circuits apply the multiple sets of testing signals at different times to overlapping and contiguous subsets of non-volatile storage devices after each erase signal of the second set of erase signals.

17. The non-volatile storage apparatus according to claim 13, further comprising:
word lines, the non-volatile storage elements are NAND flash memory devices arranged on NAND strings, the word lines are connected to the NAND strings, the one or more managing circuits apply the testing signals to subsets of the word lines.

18. The non-volatile storage apparatus according to claim 13, wherein:
a first non-volatile storage element is in a first subset of the subsets and in a second subset of the subsets; and
the one or more managing circuits sense conditions information for the first non-volatile storage element when sensing for the first subset and separately when sensing for the second subset.

19. The non-volatile storage apparatus according to claim 13, wherein:
the testing signals are at a common voltage.

20. The non-volatile storage apparatus according to claim 13, wherein:
the one or more managing circuits apply overdrive signals to non-volatile storage elements not receiving the testing signals, the one or more managing circuits apply the overdrive signals when applying the testing signals.

21. The non-volatile storage apparatus according to claim 20, wherein:
the one or more managing circuits sense the condition information of non-volatile storage elements receiving the testing signals as part of an erase verify operation; and
overdrive signals are also used by the one or more managing circuits during read operations.

22. A non-volatile storage apparatus, comprising:
a plurality of non-volatile storage elements; and
one or more managing circuits in communication with the plurality of non-volatile storage elements, the one or more managing circuits perform an erase function on the plurality of non-volatile storage elements, the one or more managing circuits separately apply testing signals to different subsets of non-volatile storage devices including applying a different testing signal to a non-volatile storage element at an edge of a particular subset as compared to non-volatile storage elements not at edges of the particular subset, the one or more managing circuits apply overdrive signals to non-volatile storage elements not in a subset being sensed while applying the testing signals, the overdrive signals are different than the testing signals, the different subsets of the non-volatile storage elements include contiguous and connected non-volatile storage elements, the one or more managing circuits sense condition information for the different subsets in response to the testing signals, the sensing condition information is an attempt to verify the erase function.

23. The non-volatile storage apparatus according to claim 22, wherein:
the different subsets of the non-volatile storage elements include non-volatile storage elements arranged in NAND strings.

24. The non-volatile storage apparatus according to claim 22, wherein:
the applying a different testing signal to a non-volatile storage element at an edge of a particular subset as compared to non-volatile storage elements not at edges of the particular subset includes applying a higher voltage to non-volatile storage elements not at edges of the particular subset and applying a lower voltage to the non-volatile storage element at the edge of the particular subset.

25. The non-volatile storage apparatus according to claim 22, wherein:
the one or more managing circuits perform the erase function and the sensing repeatedly until one or more subsets are successfully verified.

26. The non-volatile storage apparatus according to claim 22, wherein:
the one or more managing circuits perform multiple iterations of the erase function to the plurality of non-volatile storage elements and perform verification operations on one subset of the set of non-volatile storage elements prior to the one or more managing circuits separately applying testing signals to different subsets of non-volatile storage devices.

* * * * *